(12) United States Patent
Lee et al.

(10) Patent No.: US 9,293,676 B2
(45) Date of Patent: Mar. 22, 2016

(54) LIGHT EMITTING DIODE ASSEMBLY AND METHOD FOR FABRICATING THE SAME

(71) Applicant: Seoul Viosys Co., Ltd., Ansan-si (KR)

(72) Inventors: Kyu Ho Lee, Ansan-si (KR); Chang Hoon Kim, Ansan-si (KR); Jae Ryang Choi, Ansan-si (KR); Dae Woong Suh, Ansan-si (KR)

(73) Assignee: Seoul Viosys Co., Ltd., Ansan-si (KR)

( * ) Notice: Subject to any disclaimer, the term of this patent is extended or adjusted under 35 U.S.C. 154(b) by 0 days.

(21) Appl. No.: 14/744,969

(22) Filed: Jun. 19, 2015

(65) Prior Publication Data
US 2015/0287900 A1     Oct. 8, 2015

Related U.S. Application Data

(63) Continuation of application No. 13/881,252, filed as application No. PCT/KR2010/008815 on Dec. 9, 2010, now Pat. No. 9,082,933.

(30) Foreign Application Priority Data

Nov. 5, 2010    (KR) ........................ 10-2010-0109918

(51) Int. Cl.
    *H01L 33/00*       (2010.01)
    *H01L 33/36*       (2010.01)
             (Continued)

(52) U.S. Cl.
CPC ................. *H01L 33/62* (2013.01); *H01L 24/17* (2013.01); *H01L 33/0075* (2013.01);
(Continued)

(58) Field of Classification Search
CPC ......... H01L 33/36; H01L 33/38; H01L 33/62; H01L 24/17; H01L 2924/12041; H01L 2924/01029

USPC .......... 257/76, 81, 98, 99, E33.025, E33.057, 257/E33.063, E33.067, E33.068; 438/22, 438/26, 27, 29; 372/50.12, 44.01
See application file for complete search history.

(56) References Cited

U.S. PATENT DOCUMENTS 6,936,859 B1 *   8/2005   Uemura et al. .................. 257/99
6,958,498 B2 *   10/2005   Shelton et al. .................. 257/99

(Continued)

FOREIGN PATENT DOCUMENTS

JP       2007-324582      12/2007
KR    10-2006-0029418      4/2006
(Continued)

OTHER PUBLICATIONS

International Search Report issued on Dec. 15, 2011, in International Patent Application No. PCT/KR2010/008815.
(Continued)

*Primary Examiner* — Dao H Nguyen
(74) *Attorney, Agent, or Firm* — H.C. Park & Associates, PLC (57) ABSTRACT

A method of manufacturing a light-emitting diode (LED) chip including forming an LED on a first substrate, the LED including an N-type and a P-type semiconductor layer, the LED being formed to expose surfaces of the N-type and P-type semiconductor layers, forming bumps respectively electrically connected to the N-type and P-type semiconductor layers, forming electrode pads corresponding to the bumps on a second substrate, aligning the LED chip and the second substrate so that the bumps respectively correspond to the electrode pads, and increasing a temperature of the bumps to a first temperature, applying a pressure to the first and second substrates, and increasing the temperature of the bumps to a second temperature for a first time period while maintaining the pressure, and maintaining the second temperature from the first time period to a second time period while maintaining the pressure, and then releasing the pressure and cooling the bumps.

17 Claims, 5 Drawing Sheets

(51) Int. Cl.
  *H01L 33/62* (2010.01)
  *H01L 23/00* (2006.01)
  *H01L 33/06* (2010.01)
  *H01L 33/32* (2010.01)
  *H01L 33/40* (2010.01)
  *H01L 33/46* (2010.01)
  *H01L 33/38* (2010.01)

(52) U.S. Cl.
  CPC ............... *H01L 33/06* (2013.01); *H01L 33/32* (2013.01); *H01L 33/36* (2013.01); *H01L 33/40* (2013.01); *H01L 33/46* (2013.01); *H01L 33/38* (2013.01); *H01L 2924/01029* (2013.01); *H01L 2924/12036* (2013.01); *H01L 2924/12041* (2013.01); *H01L 2933/0016* (2013.01); *H01L 2933/0066* (2013.01)

(56) References Cited

U.S. PATENT DOCUMENTS 7,723,743 B2 * 5/2010 Yahata et al. .................. 257/98
2005/0072984 A1 * 4/2005 Kwak et al. .................... 257/99
2006/0081869 A1 4/2006 Lu et al.
2009/0147816 A1 * 6/2009 Iga et al. .................... 372/50.12
2010/0320488 A1 * 12/2010 Horie .............................. 257/91

FOREIGN PATENT DOCUMENTS

KR 10-2006-0054089 5/2006
KR 10-2007-0001486 1/2007
KR 10-0975521 8/2010

OTHER PUBLICATIONS

Non-Final Office Action issued on Sep. 26, 2014, in U.S. Appl. No. 13/881,252.

Notice of Allowance issued on Mar. 6, 2015, in U.S. Appl. No. 13/881,252.

* cited by examiner

LIGHT EMITTING DIODE ASSEMBLY AND METHOD FOR FABRICATING THE SAME

CROSS-REFERENCE TO RELATED APPLICATIONS

This is a continuation of U.S. patent application Ser. No. 13/881,252, filed on Apr. 24, 2013, which is the national stage entry of International Application No. PCT/KR2010/008815, filed on Dec. 9, 2010, and claims priority to Korean Application No. 10-2010-0109918, filed on Nov. 5, 2010, which are incorporated herein by reference as if fully set forth herein.

BACKGROUND

1. Field

The present invention relates to a light emitting diode assembly and a method for fabricating the same.

2. Discussion of the Background

A light emitting diode (LED) is basically a PN junction diode that comprises a junction of a P-type semiconductor and an N-type semiconductor.

In an LED, after a P-type semiconductor and an N-type semiconductor are joined together, current is allowed to flow into the LED by applying power to the P-type and N-type semiconductors. Then, holes in the P-type semiconductor move toward the N-type semiconductor while electrons in the N-type semiconductor move toward the P-type semiconductor, so that the electrons and holes move to the PN junction portion.

While falling from a conduction band to a valance band, the electrons moving to the PN junction portion are combined with the holes. Here, energy radiates to an extent corresponding to the difference between the heights of the conduction and valance bands, i.e., the energy difference between the energies of the conduction and valance bands. Here, the energy is emitted in the form of light.

Such LEDs are semiconductor devices that emit light, and have characteristics of environment friendliness, low voltage, long lifespan, low price, and the like. Conventionally, the LEDs were frequently applied to lamps for display or devices for displaying simple information such as numerals. However, with the development of industrial technologies, particularly with the development of information display and semiconductor technologies, the LEDs have recently been used in various applications such as displays, illuminating devices, headlights for automobile, and projectors.

Meanwhile, an LED may be formed as an LED chip by growing or depositing an N-type semiconductor and a P-type semiconductor on a growth substrate or the like. Further, an LED assembly may be formed by mounting the LED chip on a carrier substrate such as a submount.

Here, there are several methods for mounting the LED chip on the carrier substrate or the like.

In a first mounting method, an LED chip is aligned on a carrier substrate and then mounted on it through wire bonding.

In a second mounting method, a bump is formed on an LED chip, and the LED chip is directly mounted on a carrier substrate or the like through flip bonding by using the bump.

Here, the second method for directly mounting the LED chip by using the bump is one of methods for mounting a flip chip.

Among LED chips, an ultraviolet LED chip that emits light having a wavelength of an ultraviolet region is frequently mounted in the form of a flip chip because of light absorption by a P-type semiconductor layer and heat generation caused by the light absorption.

Meanwhile, the second mounting method can achieve miniaturization, lightweight, cost reduction and the like, as compared with the first mounting method using the wire bonding. However, it is required to improve reliability such as the lifespan of an LED assembly.

SUMMARY

An object of the present invention is to provide an LED assembly, in which reliable flip bonding is implemented, and a method for fabricating the same.

Another object of the present invention is to provide an ultraviolet LED assembly having enhanced reliability and a method for fabricating the same.

A further object of the present invention is to provide an LED assembly, in which flip bonding is stably implemented, and a method for fabricating the same.

A still further object of the present invention is to provide an LED assembly having a bump with a new structure and a method for fabricating the same.

According to an aspect of the present invention, there is provided an LED assembly comprising an LED comprising at least an N-type semiconductor layer and a P-type semiconductor layer; and bumps provided on the LED and electrically connected to the semiconductor layers, wherein the bump comprises a first region made of a gold (Au) compound including tin (Sn) and a second region made of gold.

The LED assembly may further comprise electrode pads corresponding to the N-type semiconductor layer and the P-type semiconductor layer, wherein the first region of the bump is a predetermined region of the bump at a side of the electrode pad, and the second region of the bump is a predetermined region of the bump at a side of the semiconductor layer.

The bump may further comprise a third region between the first region and the second region, and the third region is a diffusion barrier layer.

The diffusion barrier layer may comprise nickel.

The electrode pad may be made of gold and bonded to the first region of the bump.

An N-pad may be provided between the N-type semiconductor layer and the bump, and a P-pad may be provided between the P-type semiconductor layer and the bump.

The N-pad and the P-pad may be respectively bonded to the bumps, and the N-type semiconductor layer and the P-type semiconductor layer may be electrically connected to the bumps through the N-pad and the P-pad, respectively.

The LED may be provided on a first substrate, and the electrode pads may be provided on a second substrate.

The first substrate may be a sapphire substrate, and the second substrate may be an AlN substrate.

The bumps may allow the LED and the electrode pads to be spaced apart from each other at a predetermined interval.

The gold compound may be a compound in which 80 wt % gold and 20 wt % tin are mixed.

The LED may be an ultraviolet LED for emitting light having an ultraviolet wavelength.

The N-type semiconductor layer may comprise n-AlGaN, the P-type semiconductor layer may comprise p-AlGaN, and an active layer comprising AlGaN may be further provided between the N-type semiconductor layer and the P-type semiconductor layer.

The LED assembly may further comprise a reflecting member or reflecting film on the electrode pad to reflect light emitted in the LED in a direction toward the first substrate.

According to another aspect of the present invention, there is provided an LED chip comprising a substrate; an LED provided on the substrate, the LED comprising at least an N-type semiconductor layer and a P-type semiconductor layer; and bumps provided on the LED and electrically connected to the semiconductor layers, wherein the bump comprises a first region made of a gold compound including tin and a second region made of gold.

According to a further aspect of the present invention, there is provided a method for fabricating an LED assembly comprising the steps of forming an LED on a first substrate, the LED comprising at least an N-type semiconductor layer and a P-type semiconductor layer, the LED being formed so that surfaces of the N-type and P-type semiconductor layers are exposed; forming bumps respectively electrically connected to the N-type and P-type semiconductor layers; forming electrode pads corresponding to the bumps on a second substrate; aligning the LED chip and the second substrate so that the bumps respectively correspond to the electrode pads, and increasing temperature of at least the bumps to a first temperature; applying a predetermined pressure to the first and second substrates, and increasing the temperature of at least the bumps to a second temperature for a first time while maintaining the predetermined pressure; and maintaining the second temperature from the first time to a second time while maintaining the predetermined pressure, and then releasing the predetermined pressure and cooling the bumps, wherein a first region of the bump at a side of the electrode pad is made of a gold compound including tin, and a second region of the bump at a side of the semiconductor layer is made of gold.

Preferably, the first temperature is 150° C., the second temperature is 320° C., the predetermined pressure is 200 g, the first time is 70 seconds, and the second time is 80 seconds.

According to the present invention, there are advantageously provided an LED assembly, in which reliable flip bonding is performed, and a method for fabricating the same.

Also, according to the present invention, there are advantageously provided an LED assembly having enhanced reliability and a method for fabricating the same.

Further, according to the present invention, there are advantageously provided an LED assembly, in which flip bonding is stably performed, and a method for fabricating the same.

Moreover, according to the present invention, there are advantageously provided an LED assembly having bumps with a new structure and a method for fabricating the same.

DETAILED DESCRIPTION OF THE ILLUSTRATED EMBODIMENTS

Hereinafter, preferred embodiments of the present invention will be described in detail with reference to the accompanying drawings.

Figure 1:
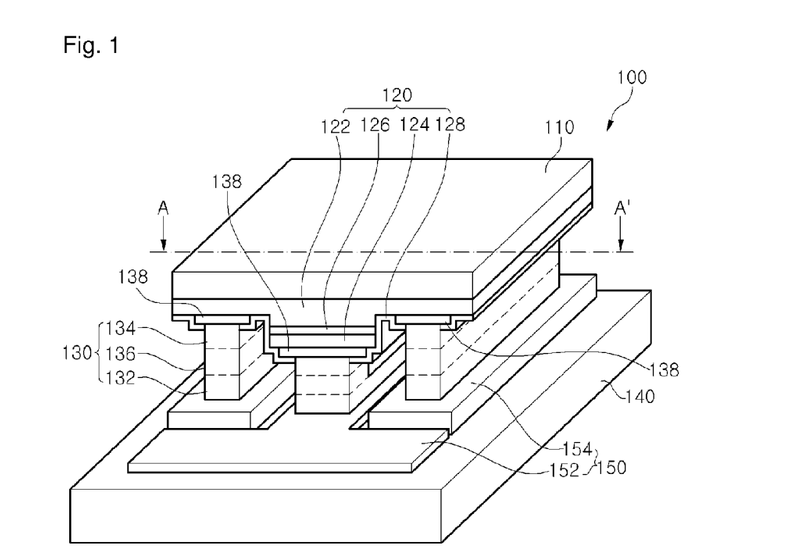
FIG. 1 is a perspective view showing an LED assembly according to an embodiment of the present invention.
Figure 2:
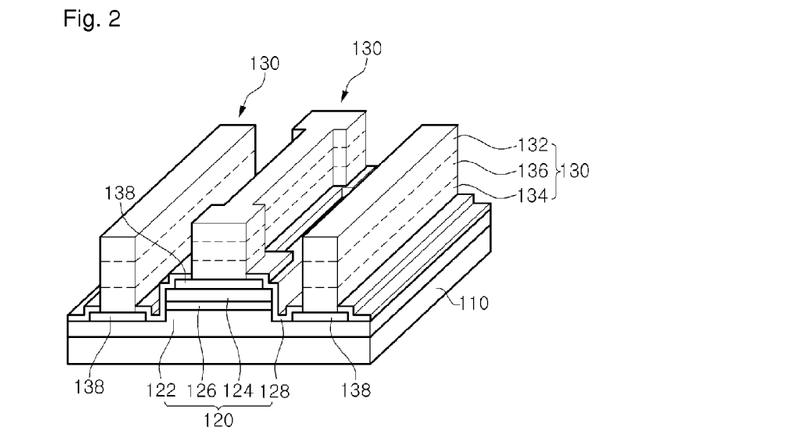
FIGS. 2 and 3 are exploded perspective views of the LED assembly shown in FIG. 1.
Figure 3:
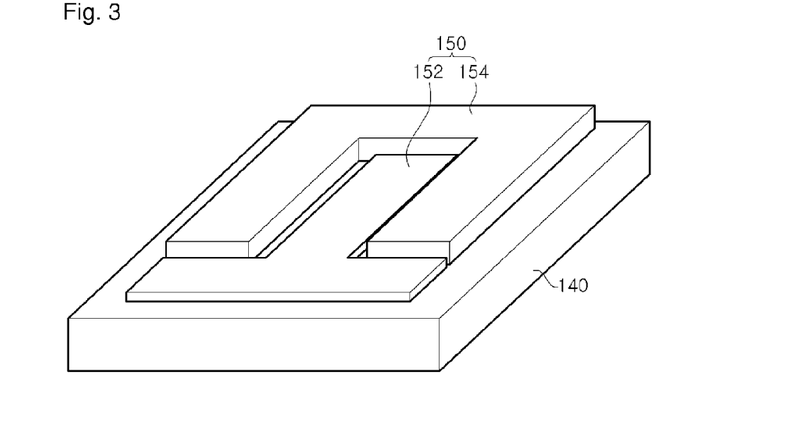

FIG. 1 is a perspective view showing an LED assembly according to an embodiment of the present invention. FIGS. 2 and 3 are exploded perspective views of the LED assembly shown in FIG. 1.

Referring to FIGS. 1 to 3, the LED assembly 100 according to an embodiment of the present invention comprises a first substrate 110, an LED 120, bumps 130, a second substrate 140 and electrode pads 150.

The first substrate 110 may be a light transmissive substrate for allowing light to be transmitted therethrough.

Preferably, the first substrate 110 may be a growth substrate for growing a semiconductor layer. For example, the growth substrate may be, but not particularly limited, a sapphire substrate, silicon carbide substrate, silicon substrate, or the like.

The LED 120 comprises at least N-type and P-type semiconductor layers 122 and 124. The LED 120 may comprise an active layer 126 interposed between the N-type and P-type semiconductor layers 122 and 124, and an insulating layer 128 for protecting the N-type semiconductor layer 122, the P-type semiconductor layer 124 and the active layer 126, as shown in FIGS. 1 and 2.

The N-type semiconductor layer 122 may be a layer made of a semiconductor material doped with an N-type impurity, and the P-type semiconductor layer 124 may be a layer made of a semiconductor material doped with a P-type impurity.

The N-type and P-type semiconductor layers 122 and 124 may be formed to have a single- or multiple-layered structure. Although not shown in the figures, the N-type or P-type semiconductor layer may comprise a contact layer and a clad layer, and may further comprise a superlattice layer.

The active layer 126 may be configured as a single layer, and may have a single or multiple quantum well structure.

Here, the N-type semiconductor layer 122, the P-type semiconductor layer 124 and the active layer 126 may be made of various materials depending on the wavelength of light emitted by the LED 120.

If the LED 120 is intended to emit ultraviolet light, e.g., ultraviolet light with a wavelength of 280 nm, the N-type semiconductor layer 122, the p-type semiconductor layer 124 and the active layer 126 may include n-AlGaN, p-AlGaN and AlGaN, respectively.

The insulating layer 128 functions to protect the N-type semiconductor layer 122, the P-type semiconductor layer 124 and the active layer 126 in the LED 120. That is, the insulating layer 128 functions to protect a surface of the P-type semiconductor layer 124, which is an uppermost layer, side surfaces of the P-type semiconductor and active layers 124 and 126, which are etched for exposure of the N-type semiconductor layer 122, and an etched and exposed surface of the N-type semiconductor layer 122.

Here, the insulating layer 128 may be provided in the form in which predetermined regions are open for the bumps 130 to be connected to the N-type semiconductor layer 122 and the P-type semiconductor layer 124. Also, the insulating layer 128 may be made of an insulator including an oxide or nitride, and may be preferably made of a silicon oxide.

Meanwhile, although not shown in the figures, pads 138 may be provided between the bumps 130, which will be described later, and the semiconductor layers 122 and 124. Particularly, an N-pad may be provided between the N-type semiconductor layer 122 and the bump 130, and a P-pad may be provided between the P-type semiconductor layer 124 and the bump 130. Here, the N-pad may be made of Ti/Au, and the P-pad may also be made of Ti/Au.

Each of the pads 138 may comprise an ohmic contact layer (not shown) that is in contact with the semiconductor 122 or 124 in a predetermined region of a lower portion of the pad. Here, the ohmic contact layer may comprise a Ti/Al or Ni/Au layer. Particularly, the N-type semiconductor layer 122 may have an ohmic contact layer comprising a Ti/Al layer formed thereon, and the P-type semiconductor layer 124 may have an ohmic contact layer comprising an Ni/Au layer formed on thereon in consideration of the property of the P-type semiconductor layer 124.

Although not specifically shown in the figures, an N-pad including an ohmic contact layer may be provided between the N-type semiconductor layer 122 and the bump 130, and a P-pad including an ohmic contact layer may be provided between the P-type semiconductor layer 124 and the bump 130. The pads 138 may be provided, but the ohmic contact layers may be omitted. On the contrary, the ohmic contact layers may be provided, but the pads 138 may be omitted.

Here, the combination of the first substrate 110 and the LED 120 provided on the first substrate 110 may be referred to as an LED chip. Therefore, the LED chip is meant to comprise the LED 120 and the first substrate 110. The LED 120 comprises at least the semiconductor layers 122 and 124, and further comprises the pad 138 or the insulating layer 128.

The bumps 130 may be provided on the LED 120. The respective bumps 130 are electrically connected to the N-type semiconductor layer 122 and the P-type semiconductor layer 124 in the LED 120.

The bumps 130 may be formed by being in direct contact with the N-type semiconductor layer 122 and the P-type semiconductor layer 124. In a case where the ohmic contact layers or the pads 138 are provided on the N-type semiconductor layer 122 and the P-type semiconductor layer 124, respectively, the bumps 130 may be formed by being in contact with the ohmic contact layers or the pads 138.

The bumps 130 functions not only to connect the LED 120 to the electrode pads 150 but also to allow the LED 120 to be spaced apart from the electrode pads 150 or second substrate 140 at a predetermined interval. The spacing of the LED 120 form the electrode pads 150 or second substrate 140 enables heat generated in the LED 120 to be easily dissipated to the outside.

Each of the bumps 130 may include three regions. That is, each of the bumps 130 may include a first region 132 that is a predetermined region at the side of the electrode pad 150, a second region 134 that is a predetermined region at the side of the N-type or P-type semiconductor layer 122 or 124, and a third region 136 between the first region 132 and the second region 134, wherein these regions will be described below.

Here, "a predetermined region at the side of the electrode pad 150" and "a predetermined region at the side of the N-type or P-type semiconductor layer 122 or 124" mean predetermined regions in which the bumps 130 are in contact with or adjacent to the electrode pad 150 and the N-type or P-type semiconductor layer 122 or 124, respectively.

The first region 132 may be made of a gold (Au) compound including tin (Sn). The first region 132 is preferably made of a material having low melting point. Here, the gold compound may be AuSn in which 80 wt % gold and 20 wt % tin are mixed.

Preferably, the second region 134 has a higher melting point and greater hardness than the first region 132. Further, the second region is preferably made of a material having high thermal conductivity. The second region is provided to allow heat generated in the LED 120 to be easily dissipated while supporting the LED 120. The second region 134 may be made of gold.

The third region 136 is positioned between the first region 132 and the second region 134, and may be a diffusion barrier layer that functions to prevent the materials that constitute the first region 132 and the second region 134 from being diffused to each other. Particularly, the diffusion barrier layer functions to prevent the composition of the gold compound in the first region 132 from being changed due to the diffusion of the tin or gold in the first region 132 to the second region 134. In a case where the gold compound is a compound of tin and gold, this is because the melting point of the first region 132 is changed as the ratio by weight of the tin and gold is changed, and therefore, the flip bonding of the bumps 130 may not be easily preformed.

The third region 136 prevents the materials that constitute the first and second regions 132 and 134 from being diffused to each other, and may be made of any material as long as it has high electrical conductivity. Preferably, the third region 136, i.e., the diffusion barrier layer may comprise nickel (Ni).

Meanwhile, all the bumps 130 may be provided to have the same thickness. Therefore, the bumps 130 respectively provided on the N-type and P-type semiconductor layers 122 and 124 are different from each other in height as shown in FIGS. 1 and 2. The difference is compensated by the electrode pads 150 which will be described later.

The second substrate 140 may be a mounting substrate or a carrier substrate, and may be an AlN substrate made of AlN. Further, the second substrate 140 may be a submount having the LED 120 mounted thereon.

The electrode pads 150 may be provided on the second substrate 140. The electrode pads 150 may comprise a P-electrode pad 152 and an N-electrode pad 154.

Here, the P-electrode pad 152 and the N-electrode pad 154 are provided to have different thicknesses from each other so as to compensate for the height difference between the bumps 130. That is, the N-electrode pad 154 is formed thicker than the P-electrode pad 152 to thereby compensate for a step caused by the height difference between the bumps 130.

The electrode pads 150 may be made of gold or gold compound (e.g., AuSn) including gold for the purpose of simplicity of flip bonding to the bumps 130 and electrical and thermal conductivity. That is, in a case where the first regions 132 of the bumps 130 are made of a gold compound including tin, they can be easily flip-bonded to the electrode pads 150 made of gold. In a case where the electrode pads 150 include gold having high thermal conductivity, they enable the heat generated in the LED 120 to be smoothly conducted and then dissipated when the heat generated in the LED 120 is conducted through the bump 130.

FIGS. 4 to 10 are sectional views and a graph illustrating a process of fabricating the LED assembly according to the embodiment of the present invention. Here, FIGS. 4 to 9 are sectional views showing the cross section taken along line A-A' of FIG. 1.

Figure 4:
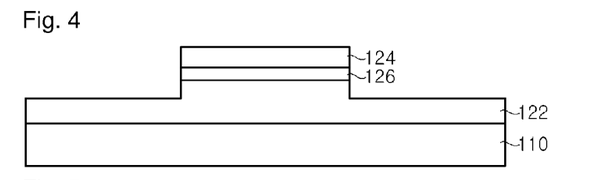
FIGS. 4 to 10 are sectional views and a graph illustrating a process of fabricating an LED assembly according to an embodiment of the present invention.

Referring to FIG. 4, an N-type semiconductor layer 122, an active layer 126 and a P-type semiconductor layer 124 are formed on a first substrate 110.

Here, the N-type semiconductor layer 122, the active layer 126 and the P-type semiconductor layer 124 may be formed by sequentially forming the semiconductor layers using a semiconductor layer forming method, such as a metal oxide chemical vapor deposition (MOCVD) method, a molecular beam epitaxy (MBE) method, and an epitaxial growth method, which are known in the art, and then etching portions of the P-type semiconductor and active layers 124 and 126 so that a partial surface of the N-type semiconductor layer 122 is exposed as shown in FIG. 4.

Figure 5:
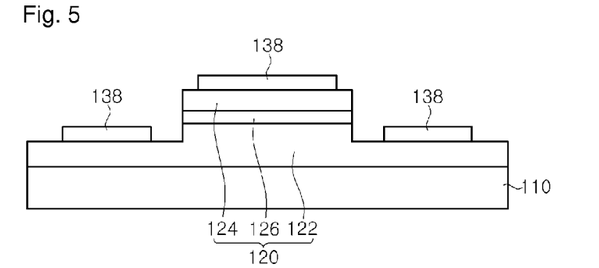

Referring to FIG. 5, pads 138, i.e., an N-pad that is the pad 138 formed on the N-type semiconductor layer 122 and a P-pad that is the pad 138 formed on the P-type semiconductor layer 124, are formed on the N-type and P-type semiconductor layers 122 and 124.

The pads 138 may be formed of Ti/Au. In a case where the pads 138 each having an ohmic contact layer are formed, a Ti/Al layer and an Ni/Al layer are first formed on the N-type semiconductor layer 122 and the P-type semiconductor layer 124, and Ti/Au layers are then formed thereon, respectively, thereby forming the pads 138 each having the ohmic contact layer. That is, the pad 138 having the ohmic contact layer on the N-type semiconductor layer 122 may be formed by sequentially forming the Ti/Al and Ti/Au layers on the N-type semiconductor layer 122, and the pad 138 having the ohmic contact layer on the P-type semiconductor layer 124 may be formed by sequentially forming the Ni/Al and Ti/Au layers on the P-type semiconductor layer 124.

Figure 6:
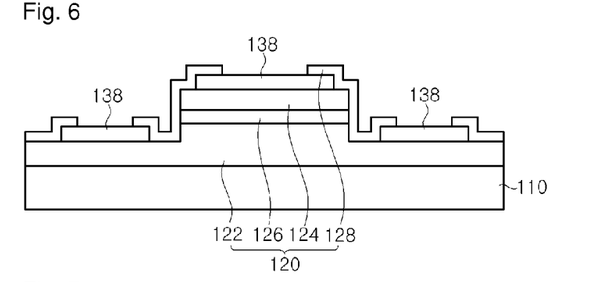

Referring to FIG. 6, after an insulating film is formed on the surface of the first substrate 110 on which the N-type semiconductor layer 122, the active layer 126 and the P-type semiconductor layer 124 are formed, predetermined regions of the insulating film are etched so that partial surfaces of the pads 138 are exposed, thereby forming an insulating layer 128.

That is, the insulating film is formed on the entire surface of the substrate, and predetermined regions of the pads 138 are then exposed, whereby the insulating layer 128 functions to cover and protect side surfaces of the P-type semiconductor layer 124 and the active layer 126, exposed by the etching described with reference to FIG. 4, and surfaces of the N-type and P-type semiconductor layers 122 and 124 exposed after forming the pads 138 described with reference to FIG. 5.

Through the aforementioned processes, an LED chip 100 may be formed by forming an LED 120 comprising the semiconductor layers 122, 124 and 126, the pads 138 and the insulating layer 128 formed on the first substrate 110.

Figure 7:
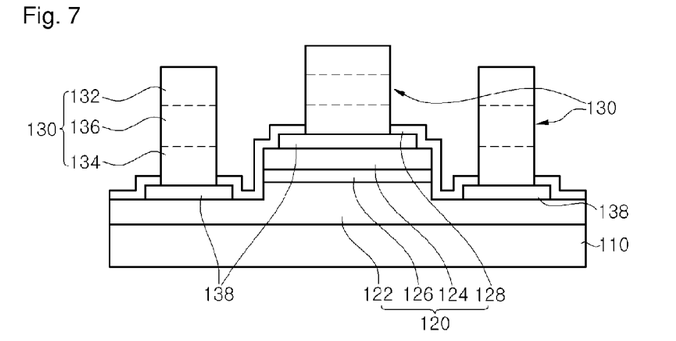

Referring to FIG. 7, bumps 130 are formed on the pads 138 of the LED chip 100, respectively.

Here, the bumps 130 may be formed by forming three layers respectively made of materials for forming a second region 134, a third region 136 and a first region 132 on the LED chip 100 and then etching them.

That is, the bumps 130 each having the second, third and first regions 134, 136 and 132 are formed by sequentially forming a material layer (e.g., a gold layer including gold) for forming the second region, a diffusion barrier layer (e.g., a nickel layer including nickel) and a gold compound layer including tin (e.g., an AuSn layer) on the first substrate 110 and then etching them.

Here, if the bumps 130 are simultaneously formed on the N-type and P-type semiconductor layers 122 and 124, they have the same thickness (i.e., height). Therefore, as shown in FIG. 7, a step may occur between the bump 130 formed on the N-type semiconductor layer 122 and the bump 130 formed on the P-type semiconductor layer 124.

The step may be compensated by electrode pads 150 which will be described later with reference to FIG. 8.

Figure 8:
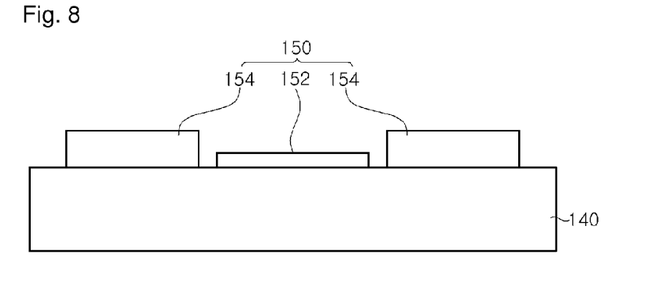

Referring to FIG. 8, the electrode pads 150 are formed on a second substrate 140.

Here, the electrode pads 150 may be formed corresponding to the bumps 130 described with reference to FIG. 7, i.e., the N-type and P-type semiconductor layers 122 and 124. The electrode pads 150 may comprise an N-electrode pad 154 corresponding to the bump 130 formed on the N-type semiconductor layer 122 and a P-electrode pad 152 corresponding to the bump 130 formed on the P-type semiconductor layer 124.

As shown in FIG. 8, the N-electrode pad 154 may be formed thicker than the P-electrode pad 152. The thicker N-electrode pad is 154 to compensate for the step between the bumps 130 described with reference to FIG. 7.

Therefore, the electrode pads 150 may be formed by using a method in which the P-electrode pad 152 and the N-electrode pad 154 are separately formed by performing a deposition process twice, or a method in which the P-electrode pad 152 and the N-electrode pad 154 are simultaneously formed until the P-electrode pad 152 has a desired thickness, the P-electrode pad 152 is masked, and then the N-electrode pad 154 is formed thicker.

Figure 9:
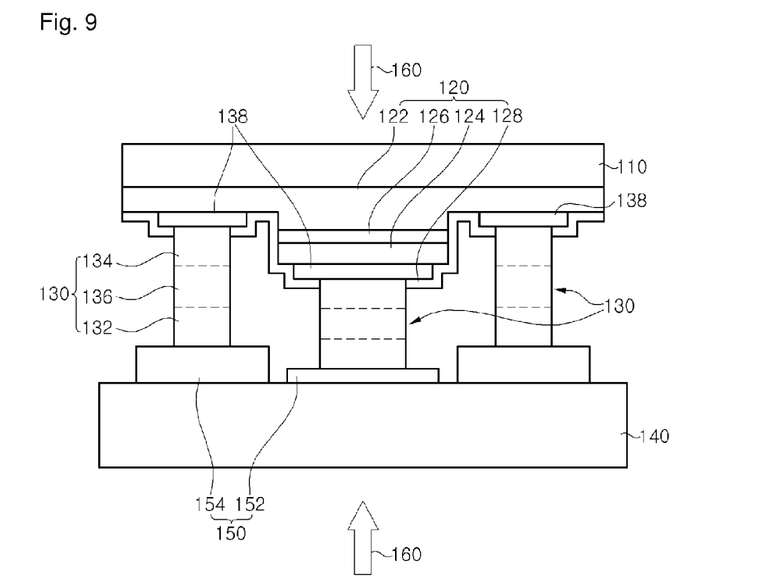
Figure 10:
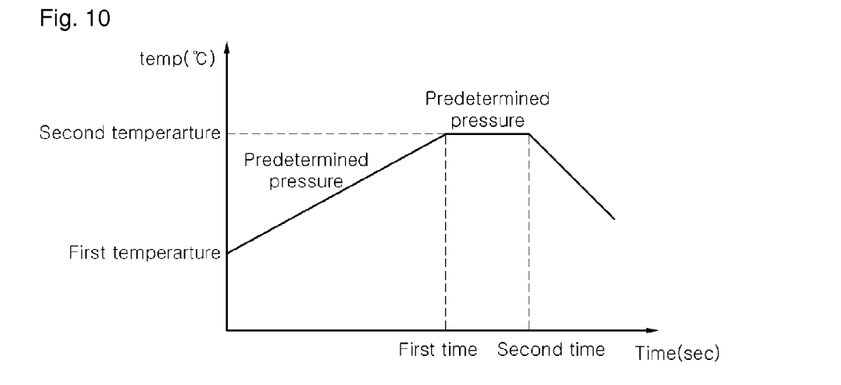

Referring to FIGS. 9 and 10, the LED chip provided with the bumps 130 (here, the LED chip has the LED 120 provided on the first substrate), the second substrate 140 provided with the electrode pads 150 and at least the bumps 130 are heated to a first temperature as shown in the graph of FIG. 10, and at the same time, the LED chip and the second substrate 140 are aligned with each other. Here, the LED chip and the second substrate 140 may be aligned based on the bumps 130 and the electrode pads 150.

As shown in FIGS. 9 and 10, the temperature of at least the bumps 130 is increased up to a second temperature while a predetermined pressure 160 is applied to the first or second substrate 110 or 140. Here, the increase from the first temperature to the second temperature is performed for a first time, and the second temperature is maintained for a predetermined time from the first time to a second time. Then, the bumps 130 are flip-bonded to the electrode pads 150 by releasing the predetermined pressure and cooling them down to the room temperature after the second time, and the LED chip having the bumps 130 is mounted on the second substrate 140 having the electrode pads 150, thereby forming the LED assembly 100 according to the embodiment of the present invention. Here, the mounting method in which the pressure is applied and simultaneously the temperature is increased as described above may be a thermo-compression (T/C) method.

In this case, conditions of the first temperature, the second temperature, the predetermined temperature, the first time, and the second time are changed depending on the bumps 130 and the electrode pads 150. That is, in a case where each of the bumps 130 includes a first region of an AuSn layer of 80 wt % gold and 20 wt % tin and the electrode pad 150 is made of gold, it is preferred that the first temperature is 150° C., the second temperature is 320° C., the predetermined pressure is 200 g, the first time is 70 seconds, and the second time is 80 seconds. In other words, after the first and second substrates 110 and 140 are aligned with each other, the first or second substrate 110 or 140 is heated to 150° C. Then, the first and second substrates 110 and 140 are heated to 320° C. by increasing the temperature for 70 seconds while a pressure of 200 g is applied thereto, and the pressure of 200 g and the temperature of 320° C. are then maintained for 10 seconds. Thereafter, the first and second substrates 110 and 140 are cooled down while releasing the pressure, so that the bumps 130 are respectively flip-bonded to the electrode pads 150.

If the bumps 130 and the electrode pads 150 are different from those described above, the conditions may be changed.

Figure 11:
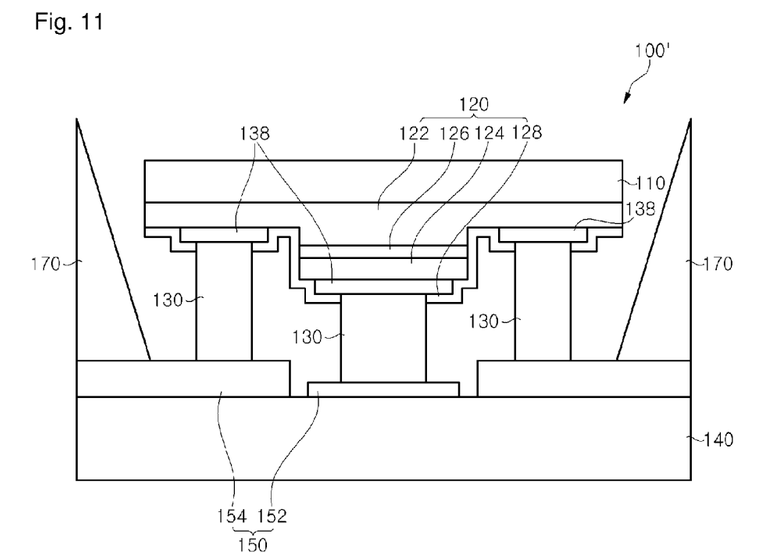
FIG. 11 is a sectional view showing an LED assembly according to another embodiment of the present invention.

FIG. 11 is a sectional view showing an LED assembly according to another embodiment of the present invention.

Referring to FIG. 11, the LED assembly 100' according to this embodiment of the present invention is almost similar to the LED assembly 100 described with reference to FIGS. 1 to 3, and a method for fabricating the LED assembly 100' is also almost similar to the method for fabricating the LED assembly 100 described with reference to FIGS. 4 to 10. Therefore, only differences will be described, and descriptions of the same configuration will be omitted.

The LED assembly 100' according to this embodiment of the present invention is identical to the LED assembly 100, except that a reflecting member 170 is provided on the second substrate 140.

Also, the method for fabricating the LED assembly 100' according to this embodiment of the present invention is identical to the method for fabricating the LED assembly 100, except that the reflecting member 170 is formed after the electrodes 150 are formed on the second substrate 140 and before the first and second substrates 110 and 140 are aligned.

The reflecting member 170 functions to increase the light extraction efficiency by reflecting light emitted from the LED 120 of the LED assembly 100'. That is, the LED assembly 100' may comprise the reflecting member 170 that functions to increase the amount of light extracted in the direction toward the first substrate 110 by reflecting the light, which is generated in the LED 120, proceeds toward the second substrate 140, and then absorbed in the second substrate 140, or the light, which is lost while proceeding toward the second substrate 140, and then allowing the light to proceed in the direction toward the first substrate 110.

As shown in FIG. 11, the reflecting member 170 is provided to have a triangular cross section so that the light generated in the LED 120 is concentrated in the upper direction of the first substrate 110, and may be made of a proper material depending on the wavelength of the light generated from the LED 120. The reflecting member may be made of a metallic material (e.g., Cu, Al, Cr, Au, Ag or the like) in a case where the LED 120 emits visible light, and may include $HfO_2$ in a case where the LED emits ultraviolet light. In a case where the reflecting member 170 is made of a metallic material, an insulating member (not shown) may be further provided between the reflecting member 170 and the electrode pads 150 for the purpose of insulation between the reflecting member 170 and the electrode pads 150. Also, in a case where the reflecting member 170 includes $HfO_2$ to reflect ultraviolet light, it is difficult to form a reflecting member of an insulator having the same shape as the reflecting member 170 shown in FIG. 12. In this case, a reflecting member having the same shape as the reflecting member 170 may be formed of another material, and a coating layer or thin film layer including $HfO_2$ may be then formed on the surface of the reflecting member.

Figure 12:
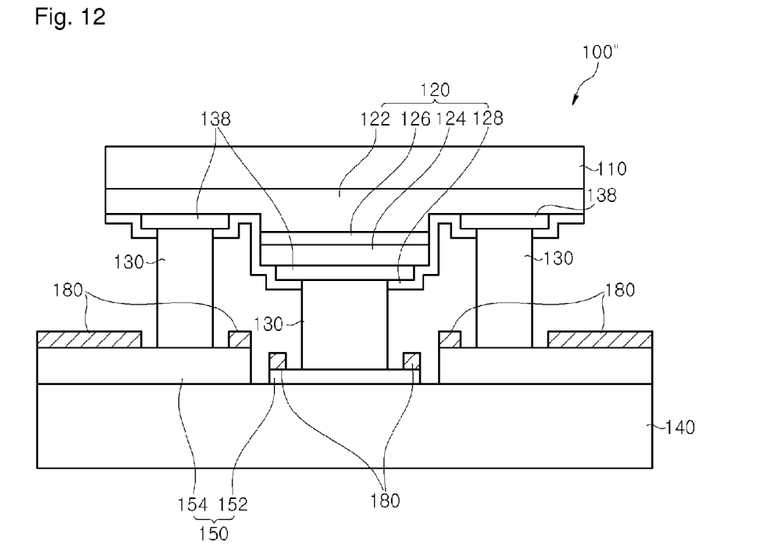
FIG. 12 is a sectional view showing an LED assembly according to a further embodiment of the present invention.

FIG. 12 is a sectional view showing an LED assembly according to a further embodiment of the present invention.

Referring to FIG. 12, the LED assembly 100" according to this embodiment of the present invention is almost similar to the LED assembly 100 described with reference to FIGS. 1 to 3, and a method for fabricating the LED assembly 100" is also almost similar to the method for fabricating the LED assembly 100 described with reference to FIGS. 4 to 10. Therefore, only differences will be described, and descriptions of the same configuration will be omitted.

The LED assembly 100" according to this embodiment of the present invention is identical to the LED assembly 100, except that a reflecting film 180 is provided on the second substrate 140.

Also, the method for fabricating the LED assembly 100" according to this embodiment of the present invention is identical to the method for fabricating the LED assembly 100, except that the reflecting film 180 is formed after the electrode pads 150 are formed on the second substrate 140 and before the first and second substrates 110 and 140 are aligned. That is, the reflecting film 180 may be formed by forming the electrode pads 150 on the second substrate 140, leaving only predetermined portions to be respectively bonded to the bumps 130 of the surfaces of the electrode pads 150, and then forming the reflecting film 180 on the other surfaces.

The reflecting film 180 functions to increase the light extraction efficiency by reflecting light emitted from the LED 120 of the LED assembly 100". That is, the LED assembly 100" may comprise the reflecting film 180 that functions to increase the amount of light extracted in the direction toward the first substrate 110 by reflecting the light, which is generated in the LED 120, proceeds toward the second substrate 140, and then absorbed in the second substrate 140, or the light, which is lost while proceeding toward the second substrate 140, and then allowing the light to proceed in the direction toward the first substrate 110.

Here, the reflecting film 180 may be made of a proper material depending on the wavelength of the light generated from the LED 120. The reflecting film may be made of a metallic material (e.g., Cu, Al, Cr, Au, Ag or the like) in a case where the LED 120 emits visible light, and may include $HfO_2$ in a case where the LED emits ultraviolet light. In a case where the reflecting film 180 is made of a metallic material, an insulating member (not shown) may be further provided between the reflecting film 180 and the electrode pads 150 for the purpose of insulation between the reflecting film 180 and the electrode pads 150. Also, in a case where the reflecting film 180 include $HfO_2$ to reflect ultraviolet light, it may be formed by coating the electrode pad 150 with the $HfO_2$. Here, in order to improve the coating or reflecting property of the $HfO_2$ layer, another layer, e.g., a $SiO_2$ layer may be further provided between the electrode pad 150 and the $HfO_2$ layer.

EXPERIMENTAL EXAMPLE

In this experimental example, the reliability of an LED assembly according to an embodiment of the present invention was evaluated. The reliability of the LED assembly 100 described with reference to FIGS. 1 to 3 was evaluated.

Here, the LED 120 of the LED assembly 100 is an ultraviolet LED that emits light having an ultraviolet wavelength. The ultraviolet LED comprises the N-type semiconductor layer 122 including n-AlGaN, the P-type semiconductor layer 124 including p-AlGaN, and the active layer 126 including AlGaN.

The ultraviolet LED was formed by growing the semiconductor layers including the N-type semiconductor layer 122, the P-type semiconductor layer 124 and the active layer 126 on a sapphire substrate using an epitaxial growth method. The N-type semiconductor layer 122, the P-type semiconductor layer 124 and the active layer 126 basically include AlGaN, and are grown by adding an N-type or P-type impurity to AlGaN.

The bump 130 comprises the first region 132 made of an AuSn layer of 80 wt % gold and 20 wt % tin, the second region 134 made of gold, and the third region 136 made of nickel.

In the ultraviolet LED, the LED chip provided with the bump 130 was mounted on the second substrate provided with the electrode pads 150, i.e., the submount provided with the electrode pads 150 by using the T/C method that is described with reference to FIGS. 9 and 10 as a mounting method.

Here, the reliability was evaluated as a change rate (%) that represents the degree of decrease in output power according to time (hour) with respect to initial output power while applying a power of 20 mA to the LED assembly at the normal temperature. The low change rate (%) means that although test time elapses, the output power is hardly changed from the initial output power, i.e., that the variation according to time becomes small. Thus, as the change rate (%) is low, the reliability of the LED assembly is excellent.

Figure 13:
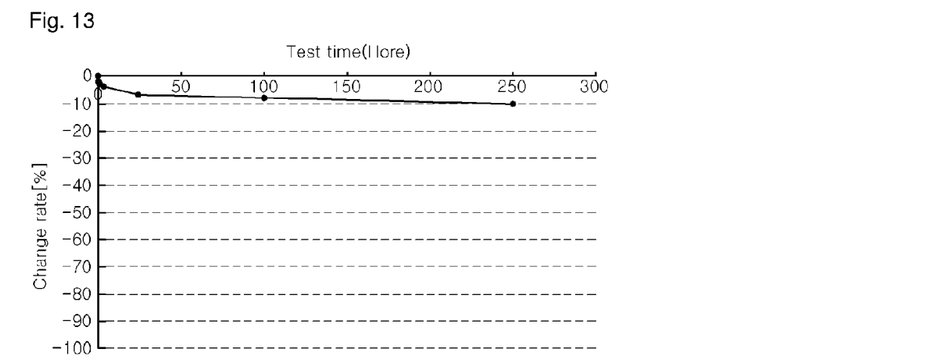
FIG. 13 is a graph showing the reliability of an LED assembly according to an example of the present invention.

FIG. 13 is a graph showing the reliability of the LED assembly according to the embodiment of the present invention.

As shown in FIG. 13, the LED assembly 100 according to the embodiment of the present invention showed a tendency that the change rate was decreased in initial test time (i.e., test time within about 25 hours) as test time elapses. However, after the test time exceeded 50 hours, the change rate was measured to be about −10%, in which the variation was slightly decreased but hardly changed. Although the test time approached 250 hours, the change rate was measured to be about −10%.

Comparative Example 1

The comparative example 1 was identical to the experimental example in that the bumps were provided using the T/C method that is the same mounting method as the experimental example, and the LED chip having the ultraviolet LED was mounted on the submount provided with the electrode pads. However, the comparative example 1 was different from the experimental example in that the bumps of the comparative example 1 were made only of gold unlike the LED assembly of the experimental example.

The reliability of the LED assembly of the comparative example 1 was measured using the same method as the reliability measuring method of the LED assembly of the above experimental example.

Figure 14:
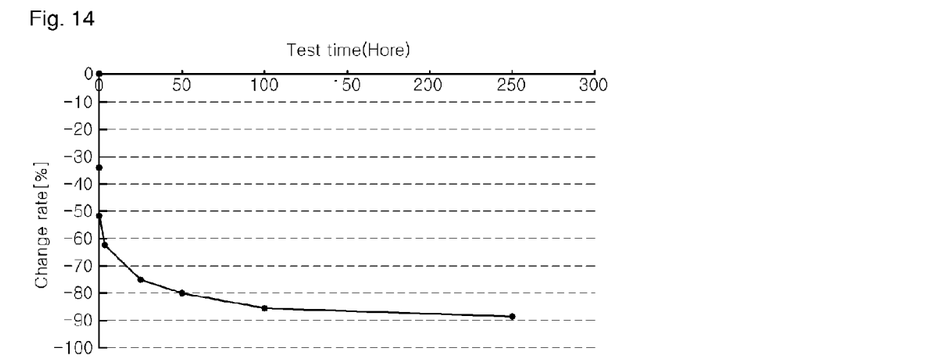
FIG. 14 is a graph showing the reliability of an LED assembly according to a first comparative example.

FIG. 14 is a graph showing the reliability of the LED assembly according to the first comparative example.

In a case where the bumps are made only of gold as shown in FIG. 14, the change rate was measured to be rapidly increased by nearly −50% as soon as the reliability measurement is started. After the test time exceeded 100 hours, the change rate was about −85%, from which it can be understood that the output power was considerably decreased as compared with the initial output power.

Comparative Example 2

The comparative example 2 was identical to the experimental example in that the same bumps as the experimental example was provided, and the LED chip having the ultraviolet LED was mounted on the submount provided with the electrode pads. However, the comparative example 2 was different from the experimental example in that the LED chip is mounted on the submount not by the T/C method but by a thermo-sonic (T/S) method.

The T/S method is a method of mounting an LED chip provided with a bump on the submount provided with an electrode pad by aligning the LED chip on the submount and then applying an ultrasonic waves with a power of 1 W for 120 seconds while applying a pressure of 700 g to a substrate of the LED chip or the submount.

Here, the submount is maintained at a temperature of 170° C., but heat is not applied to the LED chip.

The reliability of the LED assembly of the comparative example 2 was measured using the same method as the reliability measuring method of the LED assembly of the experimental example.

Figure 15:
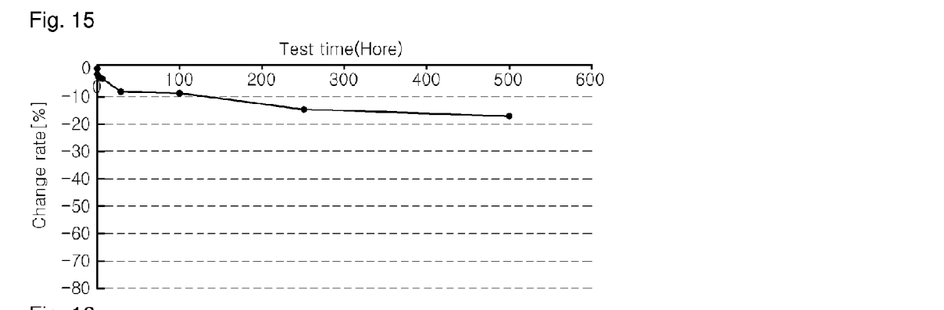
FIG. 15 is a graph showing the reliability of an LED assembly according to a second comparative example.

FIG. 15 is a graph showing the reliability the LED assembly according to the second comparative example.

As shown in FIG. 15, in the LED assembly of the comparative example, the change rate was measured to be −10% in the initial stage of the experiment. When the test time approached about 250 hours, the change rate was measured to be about −15%. Until the test time approached 500 hours, the change rate was measured to be hardly changed.

Comparative Example 3

The comparative example 3 is an LED assembly in which the bumps are made only of gold like the comparative example 1, and the LED chip is mounted on the submount using the T/S method like the comparative example 2. The reliability of the LED assembly of the comparative example 3 was measured using the same method as the reliability measuring method of the LED assembly of the experimental example.

Figure 16:
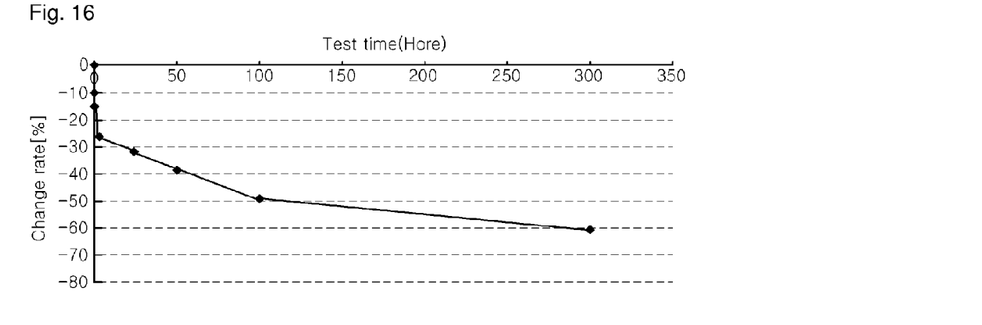
FIG. 16 is a graph showing the reliability of an LED assembly according to a third comparative example.

FIG. 16 is a graph showing the reliability of the LED assembly according to the third comparative example.

As shown in FIG. 16, in the LED assembly of this comparative example, the change rate is about −30%, which is rapidly increased in the initial stage of the experiment. Then, as the test time elapses, the change rate is gradually increased. Therefore, it can be seen that as the test time elapses, the output power is steadily decreased as compared with the initial output power.

Thus, through the reliabilities measured in the experimental example and the comparative examples 1 to 3, it can be seen that the bumps 130 including an AuSn layer of 80 wt % gold and 20 wt % tin increase the reliability of the LED assembly, particularly, the LED assembly provided with the ultraviolet LED as compared with the bumps 130 are not formed only of gold but. Also, it can also be seen that the LED chip mounted on the submount by the T/C method, as compared with the T/S method, increases the reliability of the LED assembly.

Through the experimental example and the comparative examples 1 to 3, it can be seen that when the LED chip provided with the bump including an AuSn layer of 80 wt % gold and 20 wt % tin is flip-bonded to the electrode pad made of gold, the LED chip is mounted on the submount using the T/C method disclosed in the present invention, thereby providing a reliable LED assembly.

This is because the LED assembly in the experimental example and the comparative examples 1 to 3 includes an ultraviolet LED chip, and the semiconductor layers of the ultraviolet LED chip, i.e., the N-type semiconductor layer 122, the P-type semiconductor layer 124 and the active layer 126 are grown using the epitaxial growth method.

In a case where the LED assembly has an ultraviolet LED chip, the basic material that constitutes the N-type semiconductor layer 122, the P-type semiconductor layer 124 and the active layer 126 in the ultraviolet LED chip may be AlGaN. Al and Ga in AlGaN have different diffusion lengths from each other at the same temperature, and the diffusion length of Ga is longer than that of Al. This means that Ga has a higher probability of belonging to the group-III site at the same temperature than Al. Ga has a higher probability of belonging to the group-III site at the same temperature than Al means that Ga has a higher possibility of being crystallized than Al.

Thus, in order to perform epitaxial growth with excellent crystallinity with respect to AlGaN including both Ga and Al, the epitaxial growth is necessarily performed at a temperature having a high crystallinity of Al. However, in a case where the epitaxial growth is performed at the temperature having the high crystallinity of Al, there is a problem in that Ga may be evaporated. Therefore, since AlGaN is grown at the middle between the growth temperature of GaN and the growth temperature of AlN, it is difficult to grow an AlGaN layer with high crystallinity.

The AlGaN layer grown using the growth method causing the low crystallinity has a high density of dislocation in the inside of the layer, and therefore, has bad influence on the reliability of the ultraviolet LED chip. Further, since the AlGaN layer is grown at a lower temperature than the growth temperature of AlN, the content of carbon (C) and hydrogen (H) by Al is increased in the AlGaN layer, and the carbon and hydrogen allow a non-light-emitting level, which lowers the light emitting power of the AlGaN layer.

Thus, when the ultraviolet LED chip is flip-bonded, the bump is made only of gold or bonded using the T/S method as described in the comparative examples 1 to 3, and therefore, the reliability of the LED assembly is deteriorated by having bad influence on the semiconductor layer including the AlGaN layer having high density of dislocation and high content of carbon and hydrogen. However, the bump is provided to have the AuSn layer of 80 wt % gold and 20 wt % tin and bonded using the T/C method as described in the experimental example, and thus, the reliability of the LED assembly can be increased by minimizing the bad influence on the semiconductor layer including the AlGaN layer having high density of dislocation and high content of carbon and hydrogen.

Also, the ultraviolet LED chip has a high density of dislocation and may easily be bad affected by heat because the content of carbon (C) and hydrogen (H) is high. In a case where the bump is provided to have the AuSn layer of 80 wt % gold and 20 wt % tin and bonded using the T/C method as described in the experimental example, the bonding by the bump can be stably performed and maintained as compared with the bump made only of gold or bonded using the T/S method as described in the comparative examples 1 to 3. Thus, the heat generated in the ultraviolet LED chip is effectively conducted to the submount through the bump, so that the heat sinking effect is increased. Accordingly, it is possible to minimize bad influence by the heat generated in the ultraviolet LED chip and to increase the reliability.

Although the present invention has been described in connection with the preferred embodiments, the present invention is not limited thereto. It will be understood by those skilled in the art that various modifications and changes can be made thereto without departing from the spirit and scope of the invention defined by the appended claims, and will fall within the scope of the present invention.

What is claimed is:

1. A method of manufacturing a light-emitting diode (LED) chip, the method comprising:
    forming an LED on a first substrate, the LED comprising an N-type semiconductor layer and a P-type semiconductor layer, the LED being formed to expose surfaces of the N-type and P-type semiconductor layers;
    forming bumps respectively electrically connected to the N-type and P-type semiconductor layers;
    forming electrode pads corresponding to the bumps on a second substrate;
    aligning the LED chip and the second substrate so that the bumps respectively correspond to the electrode pads, and increasing a temperature of the bumps to a first temperature;
    applying a pressure to the first and second substrates, and increasing the temperature of the bumps to a second temperature for a first time period while maintaining the pressure; and
    maintaining the second temperature from the first time period to a second time period while maintaining the pressure, and then releasing the pressure and cooling the bumps,
    wherein:
    a first region of a bump among the bumps comprises a first portion at a first side thereof adjacent to an electrode pad of the electrode pads, the first region of the bump comprising gold and tin; and
    a second region of the bump comprises a second portion at a second side thereof adjacent to a semiconductor layer among the semiconductor layers, the second region of the bump comprising gold.

2. The method of claim 1, wherein the first temperature is 150° C., the second temperature is 320° C., the pressure is 200 g, the first time is 70 seconds, and the second time is 80 seconds.

3. The method of claim 2, wherein the first region of the bump consists of 80 wt % gold and 20 wt % tin, and the electrode pads consist of gold.

4. The method of claim 1, further comprising:
    forming an N-pad between the N-type semiconductor layer and a first bump among the bumps; and
    forming a P-pad between the P-type semiconductor layer and a second bump among the bumps.

5. The method of claim 4, wherein a third region of a bump among the bumps is formed between the first region and the second region, the third region comprising a diffusion barrier layer comprising nickel.

6. A light-emitting diode (LED) chip, comprising:
    a carrier substrate;
    an LED mounted on the carrier substrate, the LED comprising an N-type semiconductor layer, active layer and a P-type semiconductor layer;
    bumps disposed on the LED and electrically connected to the semiconductor layers;
    an N-pad disposed between the N-type semiconductor layer and a first bump among the bumps;
    a P-pad disposed between the P-type semiconductor layer and a second bump among the bumps;
    an insulation layer respectively covering sides and peripheries of the N-pad and the P-pad;
    an N-electrode pad disposed between the carrier substrate and the first bump; and
    a P-electrode pad disposed between the carrier substrate and the second bump;
    wherein:
    the bumps comprise gold (Au) and each bump has the same thickness as one another;
    the P-electrode pad and the N-electrode pad comprise gold (Au); and
    the P-electrode pad is elongated between first and second portions of the N-electrode pad in a first direction perpendicular to a second direction that is the cross-sectional width of the LED chip.

7. The LED of claim 6, wherein the N-electrode pad is thicker than the P-electrode pad.

8. The LED of claim 6, wherein the LED comprises an ultraviolet LED configured to emit light having an ultraviolet wavelength.

9. The LED of claim 6, wherein:
the active layer comprises a single or multiple quantum well structure; and
the quantum well structure consists essentially of Al.

10. The LED of claim 6, wherein the LED comprises an ultraviolet LED configured to emit light having an ultraviolet wavelength.

11. The LED of claim 10, wherein the ultraviolet wavelength is substantially 280 nm.

12. The LED of claim 10, further comprising a reflecting member or reflecting film disposed on the electrode pads.

13. The LED of claim 12, wherein the reflecting member or reflecting film comprises $HfO_2$ and is configured to reflect the ultraviolet light.

14. The LED of claim 13, further comprising an $SiO_2$ layer disposed between the electrode pad and the $HfO_2$ layer.

15. The LED of claim 6, wherein the bumps further comprise a third region disposed between the first region and the second region, the third region comprising a diffusion barrier layer.

16. The LED of claim 15, wherein the diffusion barrier layer comprises nickel.

17. A light-emitting diode (LED) chip, comprising:
a carrier substrate;
an LED mounted on the carrier substrate, the LED comprising an N-type semiconductor layer, active layer and a P-type semiconductor layer;
bumps disposed on the LED and electrically connected to the semiconductor layers;
an N-pad disposed between the N-type semiconductor layer and a first bump among the bumps;
a P-pad disposed between the P-type semiconductor layer and a second bump among the bumps;
an insulation layer respectively covering sides and peripheries of the N-pad and the P-pad;
an N-electrode pad disposed between the carrier substrate and the first bump; and
a P-electrode pad disposed between the carrier substrate and the second bump;
wherein:
the bumps comprise gold (Au) and each bump has the same thickness as one another;
the P-electrode pad and the N-electrode pad comprise gold (Au);
the P-electrode pad is elongated between first and second portions of the N-electrode pad; and
the P-electrode pad and the N-electrode pad are entirely spaced apart from each other.

* * * * *